(12) United States Patent
Takahashi et al.

(10) Patent No.: US 11,217,670 B2
(45) Date of Patent: Jan. 4, 2022

(54) SEMICONDUCTOR DEVICE HAVING A BACK ELECTRODE INCLUDING AU-SB ALLOY LAYER AND METHOD OF MANUFACTURING THE SAME

(71) Applicant: RENESAS ELECTRONICS CORPORATION, Tokyo (JP)

(72) Inventors: Yuji Takahashi, Ibaraki (JP); Masaki Watanabe, Ibaraki (JP); Masashi Sahara, Ibaraki (JP); Kentaro Yamada, Ibaraki (JP); Masaki Sakashita, Ibaraki (JP); Shinichi Maeda, Ibaraki (JP); Yoshiaki Yamada, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 20 days.

(21) Appl. No.: 16/722,355

(22) Filed: Dec. 20, 2019

(65) Prior Publication Data

US 2020/0203491 A1 Jun. 25, 2020

(30) Foreign Application Priority Data

Dec. 21, 2018 (JP) .............................. JP2018-239968

(51) Int. Cl.
- *H01L 29/417* (2006.01)
- *H01L 29/732* (2006.01)
- *H01L 21/324* (2006.01)
- *H01L 29/40* (2006.01)

(Continued)

(52) U.S. Cl.
CPC .... *H01L 29/41708* (2013.01); *H01L 21/0209* (2013.01); *H01L 21/324* (2013.01); *H01L 29/401* (2013.01); *H01L 29/47* (2013.01); *H01L 29/732* (2013.01)

(58) Field of Classification Search
CPC .......... H01L 29/41708; H01L 29/6634; H01L 29/7398; H01L 2924/01079; H01L 2924/01051; H01L 29/43; H01L 29/45–456; H01L 23/4827; H01L 2224/2912; H01L 2224/29144; H01L 2224/29166; H01L 2224/2962; H01L 2224/29644; H01L 2224/29666
See application file for complete search history.

(56) References Cited

FOREIGN PATENT DOCUMENTS

| JP | 61-220344 A | 9/1986 | |
|---|---|---|---|
| JP | H0774375 A | * 3/1995 | ............. H01L 29/93 |
| JP | H0864799 A | * 3/1996 | ............. H01L 29/43 |

OTHER PUBLICATIONS

Hitoshi, Taniguchi; Machine Translation of JP-H0864799-A; Published Mar. 8, 1996 (Year: 1996).*

* cited by examiner

*Primary Examiner* — Scott B Geyer
(74) *Attorney, Agent, or Firm* — McDermott Will & Emery LLP

(57) ABSTRACT

A characteristic of a semiconductor device having a back electrode including an Au—Sb alloy is improved. The semiconductor device has a semiconductor substrate and the back electrode including the Au—Sb alloy layer. The back electrode is formed on the semiconductor substrate. The Sb concentration in the Au—Sb alloy layer is equal to or greater than 15 wt %, and equal to or less than 37 wt %. The thickness of the Au—Sb alloy layer is equal to or larger than 20 nm, and equal to or less than 45 nm.

6 Claims, 13 Drawing Sheets

(51) Int. Cl.
*H01L 21/02* (2006.01)
*H01L 29/47* (2006.01)

FIG. 12

| FORMING METHOD | Sb CONCENTRATION of TARGET [wt%] | Sb CONCENTRATION in Au-Sb ALLOY LAYER [wt%] |
|---|---|---|
| VAPOR DEMOSITION METHOD | 0.6 | 1.10 |
| | 0.6 | 0.06 |
| SPUTTERING METHOD | 26.0 | 23.0 |

FIG. 13

| Au-Sb layer | | $V_{CE(sat)}$ [mV] | PEELING TEST | CLASSIFICATION |
|---|---|---|---|---|
| Sb CONCENTRATION [wt%] | THICKNESS [nm] | | | |
| 23.0 | 9 | 302 | ○ | COMPARISON |
| 23.0 | 20 | 135 | ○ | EMBODIMENT |
| 23.0 | 45 | 135 | ○ | EMBODIMENT |
| 23.0 | 75 | 135 | × | COMPARISON |

SEMICONDUCTOR DEVICE HAVING A BACK ELECTRODE INCLUDING AU-SB ALLOY LAYER AND METHOD OF MANUFACTURING THE SAME

CROSS-REFERENCE TO RELATED APPLICATIONS

The disclosure of Japanese Patent Application No. 2018-239968 filed on Dec. 21, 2018 including the specification, drawings and abstract is incorporated herein by reference in its entirety.

BACKGROUND

The present invention relates to a semiconductor device and a method of manufacturing the same. For example, the present invention relates to a semiconductor device and a method of manufacturing the same having a back electrode including Au—Sb alloy layer.

A semiconductor device having a silicon substrate and a back electrode including a gold-antimony (AuSb) alloy layer formed on the back surface of the silicon substrate is known. The gold-antimony alloy layer can be formed on a semiconductor wafer by a vapor deposition method or a sputtering method (for example, see Japanese Unexamined Patent Application Publication No. 61-220344). The Japanese Unexamined Patent Application Publication No. 61-220344 discloses an embodiment of forming gold-antimony alloy layer on a semiconductor wafer by vapor deposition.

SUMMARY

According to the investigation by the present inventors, it has been found that as the size of the semiconductor wafer increases, it becomes difficult to form a uniform gold-antimony alloy layer on the semiconductor wafer by the vapor deposition method. Therefore, the present inventors have investigated the formation of the gold-antimony alloy layer by the sputtering method. However, if the gold-antimony alloy layer is formed by the sputtering method, the ohmic contact between the gold-antimony alloy layer and the semiconductor wafer cannot be formed, or the back electrode may be peeled off from the semiconductor wafer, resulting in inadequate semiconductor device characteristics. Therefore, there is a problem that the characteristics of the semiconductor device having the back electrode including the gold-antimony alloy layer formed by the sputtering method are enhanced. Other objects and novel features will become apparent from the description of the specification and drawings.

A semiconductor device according to one embodiment has a semiconductor substrate and an electrode including a gold-antimony (Au—Sb) alloy layer. The electrode is formed on the semiconductor substrate. An antimony (Sb) concentration in the Au—Sb alloy layer is equal to or greater than 15 wt %, and equal to or less than 37 wt %. A thickness of the gold-antimony alloy layer is equal to or larger than 20 nm, and equal to or less than 45 nm.

In addition, a method of manufacturing a semiconductor device according to one embodiment includes the steps of preparing a semiconductor wafer, and forming an electrode including a gold-antimony (Au—Sb) alloy layer on the semiconductor wafer by a sputtering method. In the step of forming the electrode, the Au—Sb alloy layer is formed by using a target made of Au—Sb alloy having an antimony (Sb) concentration of 22 wt % or more and 37 wt % or less.

According to one embodiment, the characteristics of the semiconductor device can be improved.

BRIEF DESCRIPTION OF THE DRAWINGS

FIG. 12 is a table showing the relationship between the Sb concentration of the target and the Sb concentration in the Au—Sb alloy layer.

FIG. 13 is a table showing the Sb concentration of the Au—Sb alloy layer, the thickness of the Au—Sb alloy layer, the result of evaluating the adhesion, the result of measuring the VCE(sat), and the classification of the respective semiconductor device according to the Embodiment and the COMPARISON.

DETAILED DESCRIPTION

Figure 1:
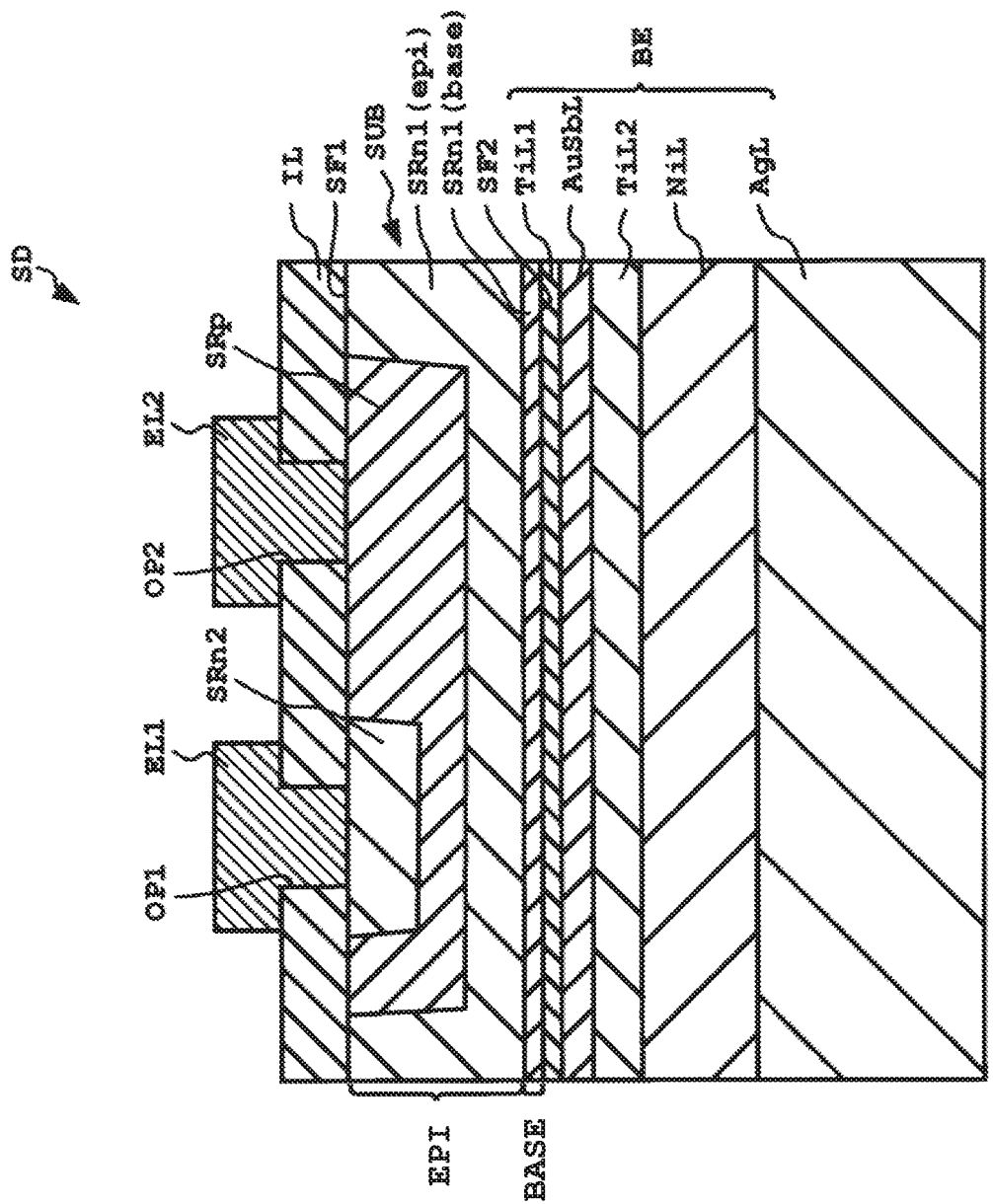
FIG. 1 is a main portion cross-sectional view illustrating an exemplary configuration of a semiconductor device according to an embodiment.

Hereinafter, a semiconductor device and its manufacturing method according to an embodiment will be described in detail by referring to the drawings. In the specification and the drawings, the same or corresponding components are denoted by the same reference numerals, and a repetitive description thereof is omitted. In the drawings, for convenience of description, the configuration may be omitted or simplified.

<Configuration of Semiconductor Device>

FIG. 1 is a main portion cross-sectional view showing an exemplary configuration of semiconductor device SDs according to present embodiment.

As shown in FIG. 1, the semiconductor device SD includes a semiconductor substrate SUB, an insulating layer IL, a first electrode EL1, a second electrode EL2, and a back electrode BE. The first electrode EL1 and the second electrode EL2 are also referred to as a surface electrode.

The semiconductor substrate SUBs include a first surface (front surface) SF1 and a second surface (back surface) SF2 that are in front and back relation to each other. Examples of types of semiconductor substrate SUBs include silicone substrate. The second surface SF2 of the semiconductor substrate SUB contacts the back electrode BE. The thickness of the semiconductor substrate SUB is, for example, 150 µm or more and 300 µm or less.

As shown in FIG. 1, a semiconductor substrate SUB has a base portion BASE and an epitaxial layer EPI formed on a base portion BASE. Of the semiconductor substrate SUB, the thickness of the epitaxial layer EPI is 10 µm or more and 130 µm or less.

Diffusion layers constituting so-called vertical transistors are formed inside the semiconductor substrate SUB. Here, the vertical transistor refers to a transistor in which channels are formed along opposite directions of the first surface SF1 and the second surface SF2 of the semiconductor substrate SUB. Examples of transistors include bipolar transistors, such as npn and pnp transistors, and IGBT. In present embodiment, the bipolar transistor is an npn transistor. As the npn transistor, a structure known as a bipolar transistor can be employed. In present embodiment, the semiconductor substrate SUB includes a 1 n-type semiconductor region SRn1, a p type semiconductor region SRp, and a 2 n-type semiconductor region SRn2.

The 1 n-type semiconductor region SRn1 adjoins the p type semiconductor region SRp, the first surface SF1 of the semiconductor substrate SUB, and the second surface SF2 of the semiconductor substrate SUB in the semiconductor substrate SUB. The 1n semiconductor region SRn1 is formed over the base portion BASE of the semiconductor substrate SUB and the epitaxial layer EPI. The 1 n-type semiconductor region SRn1 includes a first portion SRn1 (BASE) located on the base portion BASE and a second portion SRn1 (EPI) located on the epitaxial layer EPI. At least a region (first portion SRn1 (BASE)) of the semiconductor substrate SUB on the back electrode BE side contain n-type impurities (dopants). In present embodiment, the epitaxial layer EPI of the 1 n-type semiconductor region SRn1 is formed so as to cover the p type semiconductor region SRp. Examples of the n-type impurity include an antimony atom (Sb), a phosphorus atom (P), and an arsenic atom (As). In the 1 n-type semiconductor region SRn1, the concentration of the n-type impurity in the first portion SRn1 (BASE) located on the base portion BASE is, for example, the concentration of $1.5 \times 10^{18}$ cm-3 or more and the concentration of the n-type impurity is $1.2 \times 10^{19}$ cm-3 or less. In the 1 n-type semiconductor region SRn1, the concentration of the n-type impurity in the second portion SRn1 (EPI) located in the epitaxial layer EPI is, for example, $4.7 \times 10^{13}$ cm-3 or more and $3.7 \times 10^{15}$ cm-3 or less.

The p-type semiconductor region SRp is formed inside the semiconductor substrate SUB so as to be sandwiched between the 1 n-type semiconductor region SRn1 and the 2 n-type semiconductor region SRn2. The p-type impurity contains, for example, boron (B). The concentration of the p-type impurity is, for example, $1.0 \times 10^{15}$ cm-3 or more and $2.0 \times 10^{18}$ cm-3 or less.

The 2 n-type semiconductor region SRn2 is formed inside the semiconductor substrate SUB so as not to touch the 1 n-type semiconductor region SRn1 and so as to adjoin the p type semiconductor region SRp. The 2 n-type semiconductor region SRn2 is formed in a surface-electrode-side region of the semiconductor substrate SUB. Examples of the n-type impurities are the same as those of the n-type impurities included in the 1 n-type semiconductor region SRn1. The concentration of the n-type impurity is, for example, $1.0 \times 10^{18}$ cm-3 or more and $2.0 \times 10^{18}$ cm-3 or less.

The insulating layer IL is formed on the first surface SF1 of the semiconductor substrate SUB. In the insulating layer IL, a first opening OP1 exposing a part of the p-type semiconductor region SRp in the semiconductor substrate SUB and a second opening OP2 exposing a part of the 2 n-type semiconductor region SRn2 in the insulating layer IL are formed. The insulating layer IL is made of, for example, silicon oxide (SiO2).

The first electrode EL1 is an emitter electrode electrically connected to the 2 n-type semiconductor region SRn2. The first electrode EL1 is formed on the insulating layer IL so as to fill the first opening OP1 formed in the insulating layer IL. The first electrode EL1 is, for example, a metallic film containing aluminum as a main component.

The second electrode EL2 is a base electrode electrically connected to the p-type semiconductor region SRp. The second electrode EL2 is formed on the insulating layer IL so as to fill the second opening OP2 formed in the insulating layer IL. The second electrode EL2 is, for example, a metallic film containing aluminum as a main component.

The back electrode BE is a collector electrode electrically connected to the 1 n-type semiconductor region SRn1. The back electrode BE is formed on the second surface SF2 of the semiconductor substrate SUB. The back electrode BE includes a first titanium layer TiL1, a gold-antimony alloy layer AuSbL, a second titanium layer TiL2, a nickel layer NiL, and a silver layer AgL.

The first titanium layer TiL1 is a layer for increasing the adhesion of the semiconductor substrate SUB and the gold-antimony alloy layer AuSbL. The first titanium layer TiL1 is formed on the second surface SF2 of the semiconductor substrate SUB. In other words, the first titanium layer TiL1 is formed between the semiconductor substrate SUB and the gold-antimony alloy layer AuSbL.

The thickness of the first titanium layer TiL1 is not particularly limited as long as the first titanium layer can exhibit the above function. However, if the thickness of the first titanium layer TiL1 is too small, the above-mentioned function is insufficient, and an ohmic contact of the semiconductor substrate SUB and the back electrode BE tend not to be formed. Further, if the thickness of the first titanium layer TiL1 is too large, antimony atoms are not diffused from the gold-antimony alloy layer AuSbL into the semiconductor substrate SUB, and it tends to be difficult to form an ohmic contact between the semiconductor substrate SUB and the back electrode BE. For example, the thickness of the first titanium layer TiL1 is preferably equal to or larger than 15 nm, and equal to or less than 30 nm.

The gold-antimony alloy layer AuSbL is formed on the first titanium layer TiL1. In the semiconductor device SD according to present embodiment, antimony atoms diffused from the gold-antimony alloy layer AuSbL into the semiconductor substrate SUB can reduce the resistivity of the semiconductor substrate SUB.

The antimony concentration in the gold-antimony alloy layer AuSbL is, for example, equal to or greater than 15 wt %, and equal to or less than 37 wt %. The gold-antimony alloy layer AuSbL having an antimony concentration of less than 15 wt % and more than 37 wt %, which will be described later in detail, is difficult to be formed by a sputtering method because it is difficult to produce targets for sputtering.

The thickness of the gold-antimony alloy layer AuSbL is equal to or larger than 20 nm, and equal to or less than 45 nm. If the thickness of the gold-antimony alloy layer AuSbL is less than 20 nm, the amount of antimony atoms diffused into the semiconductor substrate SUB becomes insufficient, and as a result, the resistivity of the semiconductor substrate SUB cannot be sufficiently reduced. When the thickness of the gold-antimony alloy layer AuSbL is more than 45 nm, the amount of antimony atoms diffused into the semiconductor substrate SUB becomes excessive, and as a result, the adhesion between the back electrode BE and the semiconductor substrate SUB becomes inadequate. In view of the above, the thickness of the gold-antimony alloy layer AuSbL is preferably equal to or larger than 25 nm, and equal to or less than 35 nm, and more preferably about 30 nm.

The second titanium layer TiL2 is a layer that functions as a stopper when the nickel layer NiL is formed on the gold-antimony alloy layer AuSbL. The second titanium layer TiL2 is formed on the gold-antimony alloy layer AuSbL. As a result, the silicon atom (Si) diffused into the gold-antimony alloy layer AuSbL and the nickel atom (Ni) included in the nickel layer NiL react with each other to suppress an increase in the resistivity of the back electrode BE.

The thickness of the second titanium layer TiL2 is not particularly limited as long as the second titanium layer can exhibit the above function. For example, the thickness of the second titanium layer TiL2 is about 200 nm.

The nickel layer NiL is a layer functioning as a barrier film of the silver layer AgL. The nickel layer NiL is formed on the second titanium layer TiL2. The thickness of the nickel layer NiL is not particularly limited as long as it can exhibit the above function. For example, the thickness of the nickel layer NiL is about 400 nm.

The silver layer AgL is a layer for enhancing wettability with solder. The silver layer AgL is formed on the nickel layer NiL. The thickness of the silver layer AgL is not particularly limited as long as it can exhibit the above function. For example, the thickness of the silver layer AgL is about 1000 nm.

<Method of Manufacturing Semiconductor Device>

Next, the manufacturing method of the semiconductor device SDs according to present embodiment will be described. FIG. 2 to FIG. 10 are main portion cross-sectional view showing examples of the steps included in the manufacturing method of the semiconductor device SDs.

The manufacturing method of the semiconductor device SD includes 1) a step of preparing a semiconductor wafer SW, 2) a step of forming a diffused layer, 3) a step of forming an insulating layer IL, 4) a step of forming a front electrode (first electrode EL1 and second electrode EL2), 5) a step of forming a back electrode BE, and 6) an annealing step. The manufacturing method of the semiconductor device SD according to the present embodiment can be appropriately selected from the methods known as the manufacturing method of the vertical transistor except for the step of forming the back electrode BE.

1) Preparation of Semiconductor Wafer SW

Figure 2:
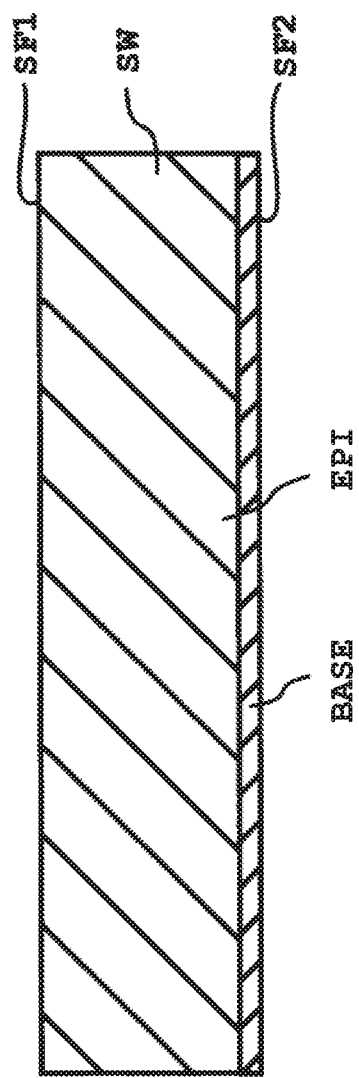
FIG. 2 is a main portion cross-sectional view showing an exemplary process included in the manufacturing method of the semiconductor device according to the embodiment.

First, as shown in FIG. 2, a semiconductor wafer SW is prepared. The semiconductor wafer SW has a first surface SF1 and a second surface SF2 which are in front and back relation to each other. The semiconductor wafer SW includes a base base and a epitaxial layer EPI. The first surface SF1 is the surface of the base portion BASE and the second surface SF2 is the surface of the epitaxial layer EPI. In present embodiment, the semiconductor wafer SW is an n-type silicon substrate containing an n-type impurity.

2) Formation of Diffusion Layer

Figure 3:
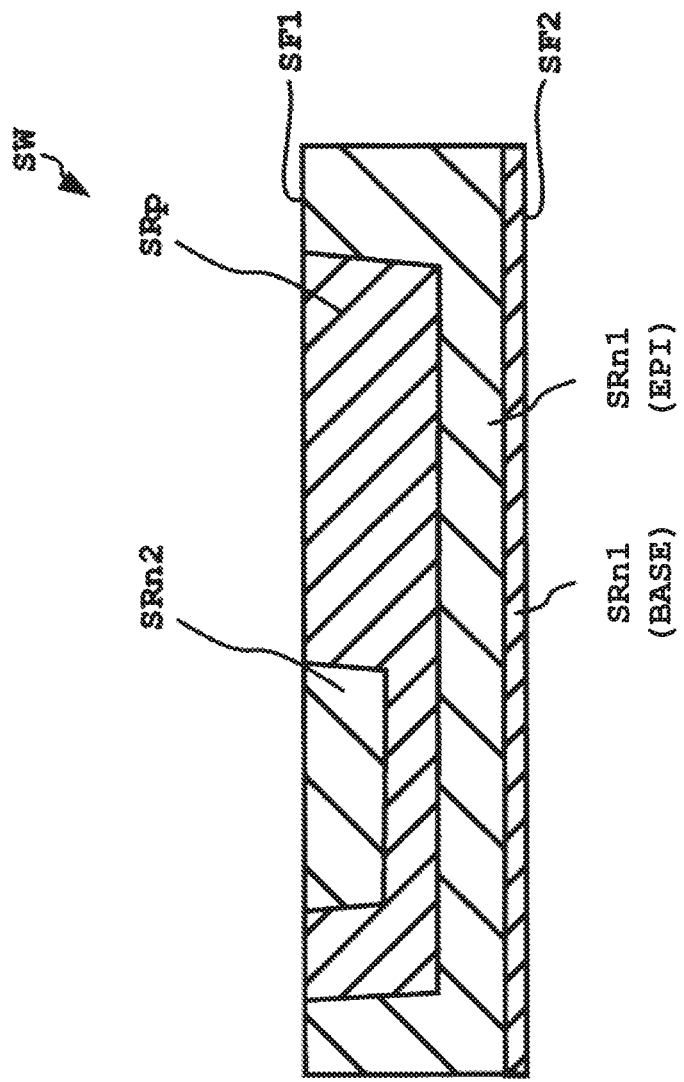
FIG. 3 is a main portion cross-sectional view showing an exemplary process included in the manufacturing method of the semiconductor device according to the embodiment.

Next, as shown in FIG. 3, a diffusion layer is formed inside the semiconductor wafer SW. In present embodiment, the 1 n-type semiconductor region SRn1, the p type semiconductor region SRp, and the 2 n-type semiconductor region SRn2 are formed inside the semiconductor wafer SW as the diffused layers. For example, each of the diffusion layers may be formed by known photolithography and ion implantation techniques.

3) Formation of Insulating Layer

Figure 4:
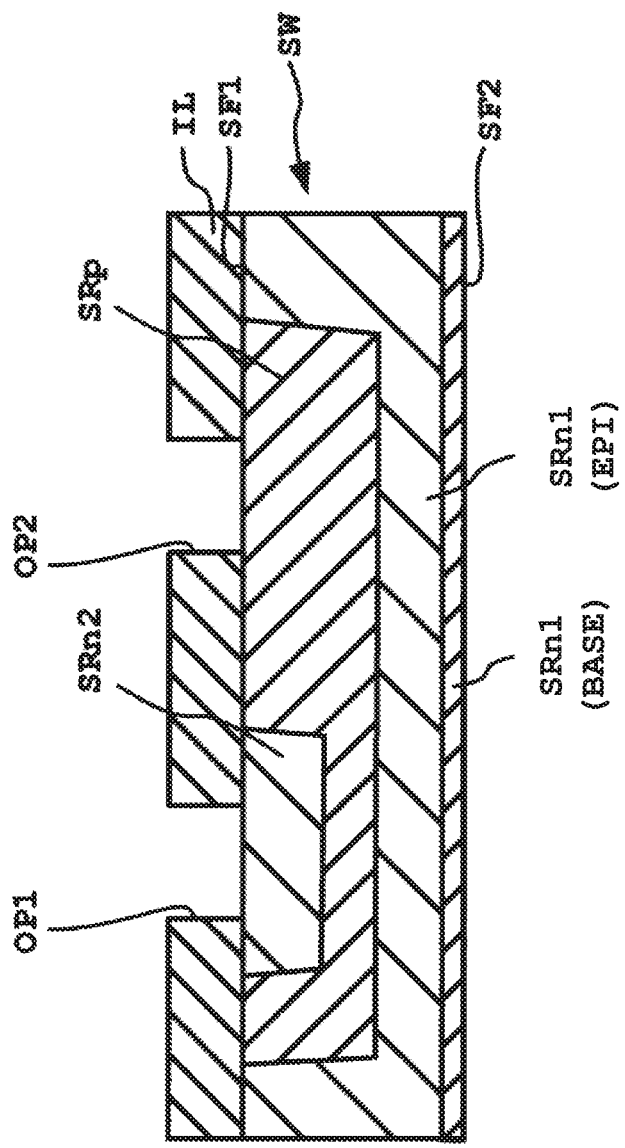
FIG. 4 is a main portion cross-sectional view showing an exemplary process included in the manufacturing method of the semiconductor device according to the embodiment.

Next, as shown in FIG. 4, the insulating layer IL in which the first opening OP1 and the second opening OP2 are formed is formed on the first surface SF1 of the semiconductor wafer SW. For example, after the insulating layer IL is formed on the first surface SF1 of the semiconductor wafer SW by the CVD method, the first opening OP1 and the second opening OP2 may be formed in the insulating layer IL by the photolithography technique and the etch technique. At this time, the first opening OP1 is formed at a position corresponding to the 2 n-type semiconductor region SRn2, and the second opening OP2 is formed at a position corresponding to the p type semiconductor region SRp. Examples of materials constituting the insulating layer IL include silicon oxide ($SiO_2$).

4) Formation of Front Surface Electrode

Figure 5:
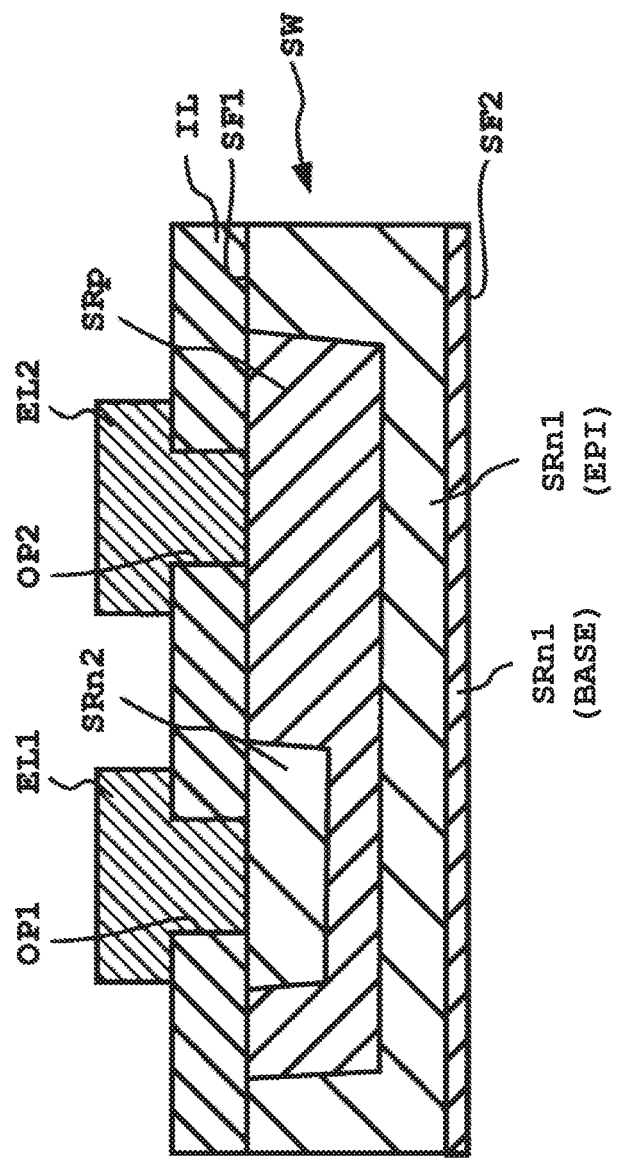
FIG. 5 is a main portion cross-sectional view showing an exemplary process included in the manufacturing method of the semiconductor device according to the embodiment.

Next, as shown in FIG. 5, a first electrode EL1 and a second electrode EL2 are formed on the insulating layer IL. For example, after a conductive film is formed on the insulating layer IL to fill the first opening OP1 and the second opening OP2 by a sputtering method, the first electrode EL1 and the second electrode EL2 can be formed by processing the conductive film into desired patterns by a photolithography technique and an etch technique. Examples of materials constituting the first electrode EL1 and the second electrode EL2 include aluminum.

5) Formation of Back Surface Electrode

Next, the back electrode BE is formed on the second surface SF2 of the wafer SW. In present embodiment, the process of forming the back electrode BE includes 5-1) a process of forming the first titanium layer TiL1, 5-2) a process of forming the gold-antimony alloy layer AuSbL, 5-3) a process of forming the second titanium layer TiL2, 5-4) a process of forming the nickel layer NiL, and 5-5) a process of forming the silver layer AgL. The method of forming the back electrode BE according to the present embodiment can be appropriately selected from known method as a method of forming the back electrode BE of the vertical transistor except for the step of forming the gold-antimony alloy layer AuSbL.

5-1) Formation of First Ti Layer TiL1

Figure 6:
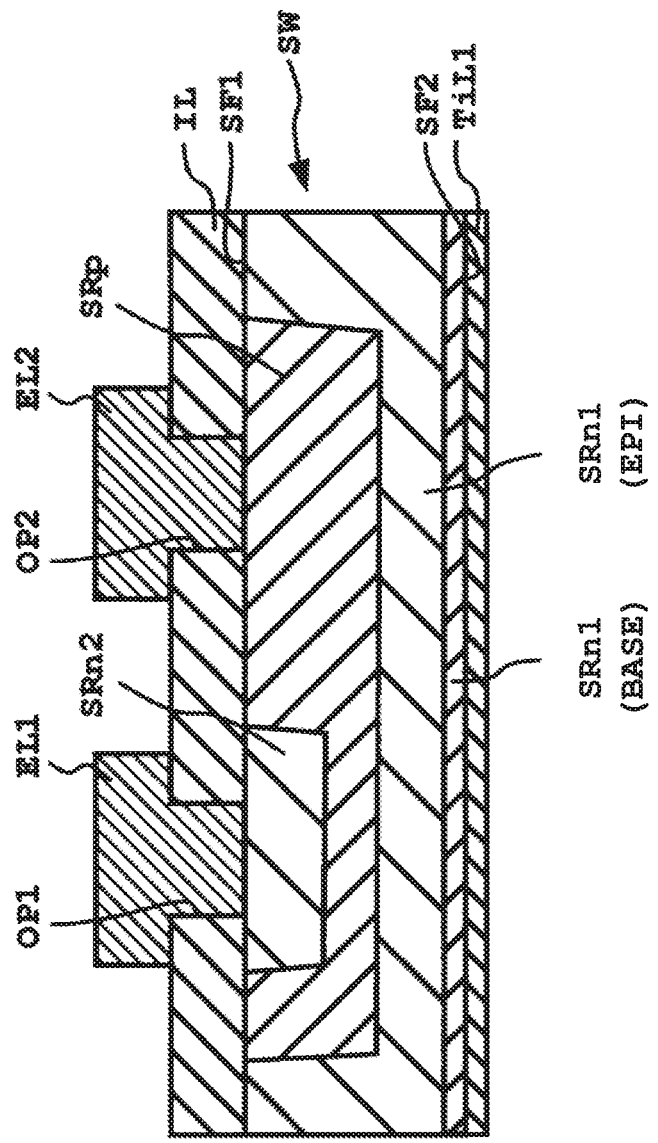
FIG. 6 is a main portion cross-sectional view showing an exemplary process included in the manufacturing method of the semiconductor device according to the embodiment.

First, as shown in FIG. 6, a first titanium (Ti) layer TiL1 is formed on the second surface SF2 of the semiconductor wafer SW. For example, the first titanium layer TiL1 may be formed by a sputtering method.

5-2) Formation of Au—Sb Alloy Layer AuSbL

Figure 7:
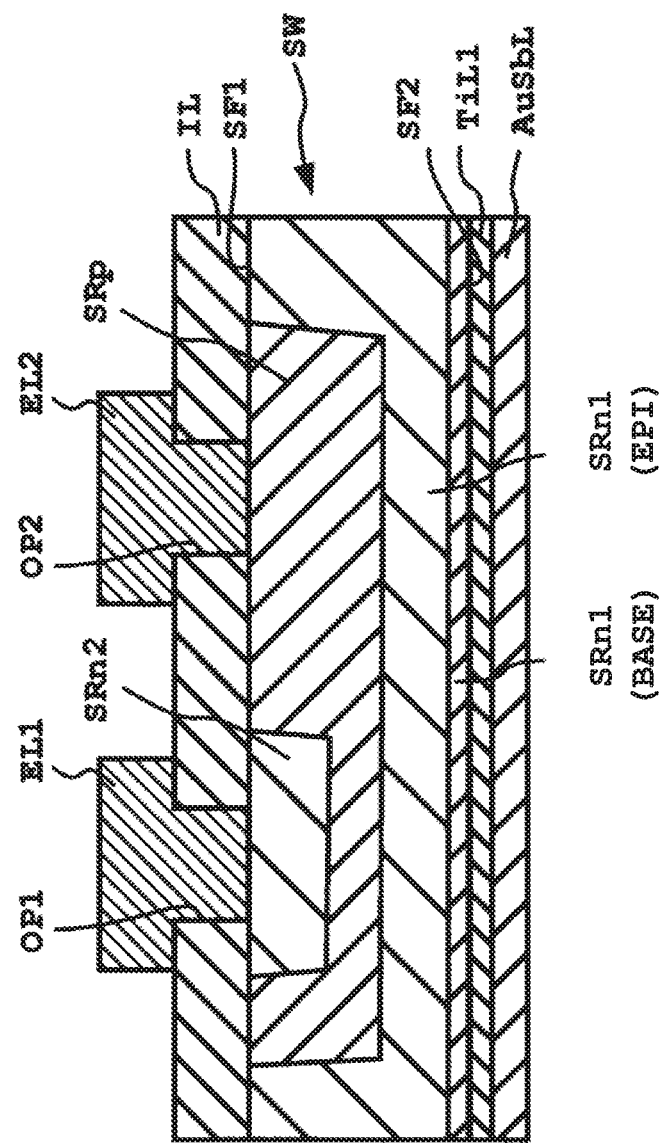
FIG. 7 is a main portion cross-sectional view showing an exemplary process included in the manufacturing method of the semiconductor device according to the embodiment.

Next, as shown in FIG. 7, a gold-antimony (Au—Sb) alloy layer AuSbL is formed on the first titanium layer TiL1. The gold-antimony alloy layer AuSbL may be formed by a sputtering method. Present embodiment uses a target composed of a gold-antimony alloy with an antimony concentration of 22 wt % or more and 37 wt % or less. In other words, present embodiment uses a target made of a gold-antimony alloy having a melting point of 360° C. or more and 430° C. or less. Details of the reason why the target is used will be described later.

The target can be produced by a process known as a manufacturing method of a target for sputtering, except for a mixing ratio of gold atoms and antimony atoms which are contained components. The sputtering condition such as the output power of the DC power supply and the sputtering time can be appropriately adjusted in accordance with the thickness of the gold-antimony alloy layer AuSbL. For example, the output power of the DC power supply is about 2 kW, and the sputtering time is about 10 seconds.

5-3) Formation of Second Ti Layer TiL2

Figure 8:
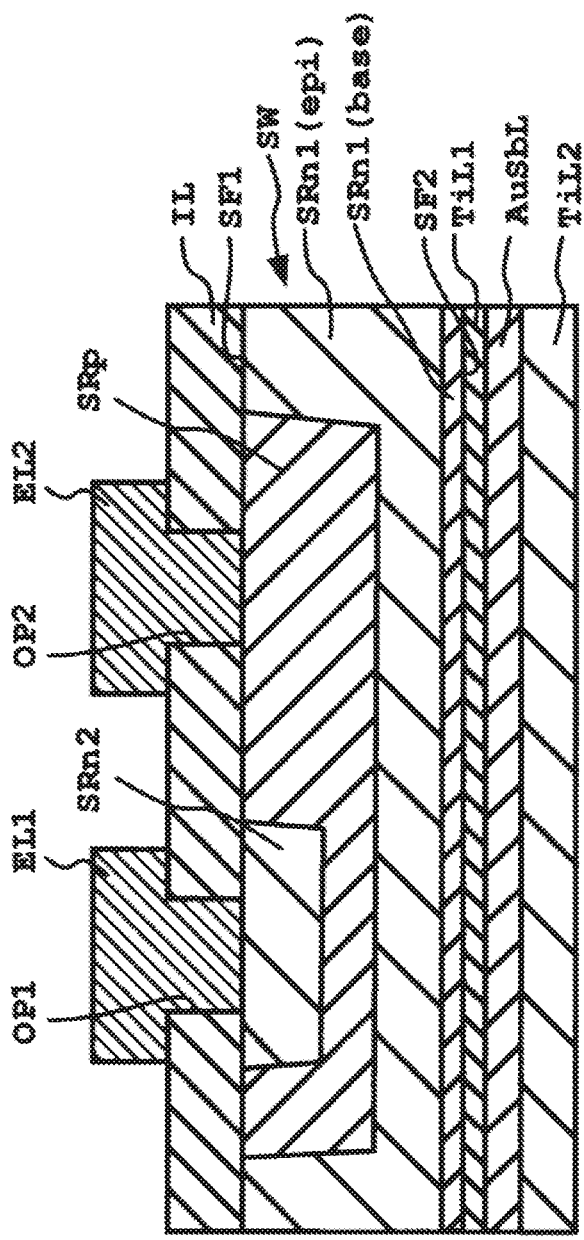
FIG. 8 is a main portion cross-sectional view showing an exemplary process included in the manufacturing method of the semiconductor device according to the embodiment.

Next, as shown in FIG. 8, the second titanium (Ti) layer TiL2 is formed on the Au—Sb alloy layer AuSbL. For example, the second titanium layer TiL2 may also be formed by a sputtering method.

5-4) Formation of Ni Layer NiL

Figure 9:
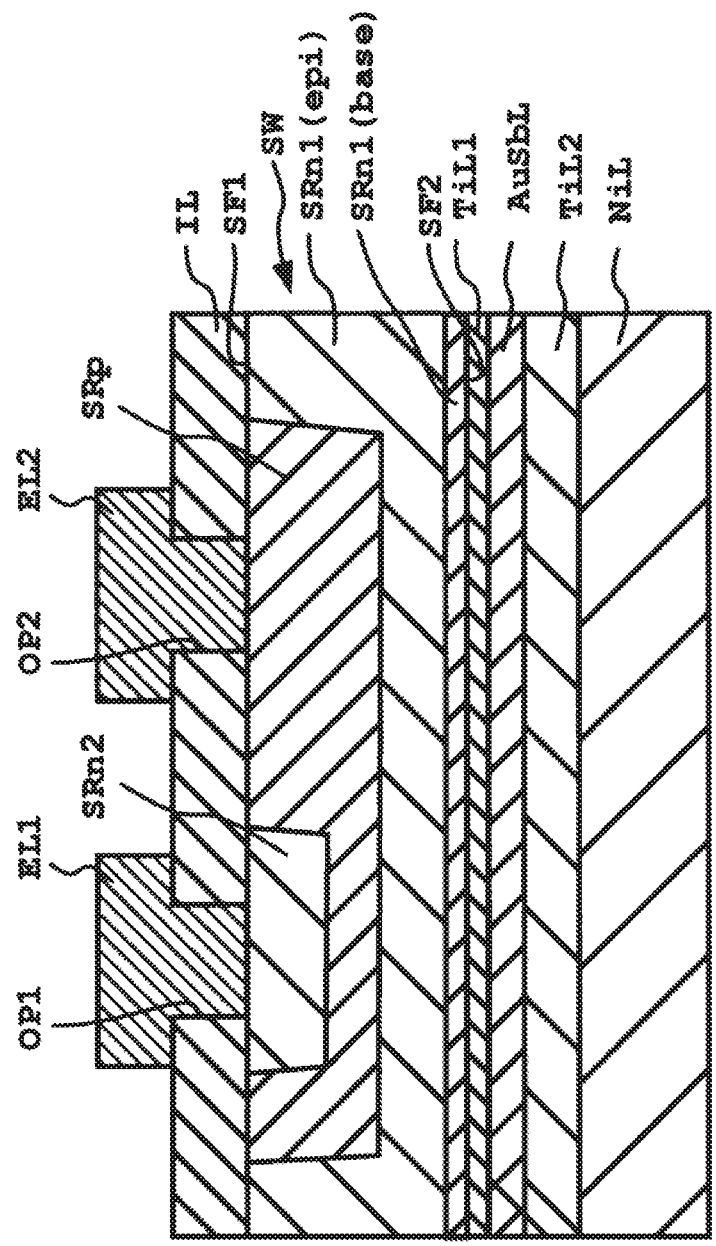
FIG. 9 is a main portion cross-sectional view showing an exemplary process included in the manufacturing method of the semiconductor device according to the embodiment.

Next, as shown in FIG. 9, a nickel (Ni) layer NiL is formed on the second titanium layer TiL2. For example, the nickel layer NiL can also be formed by a sputtering method.

5-5) Formation of Ag Layer AgL

Figure 10:
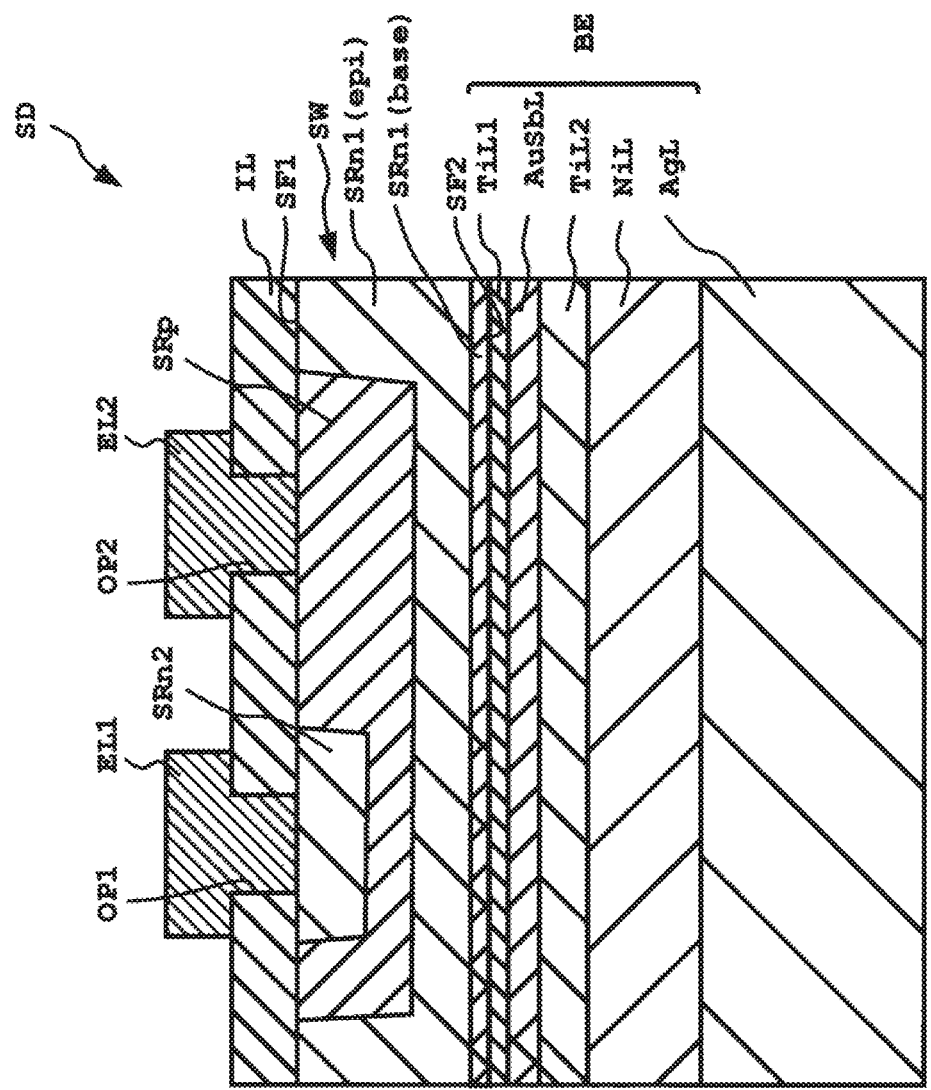
FIG. 10 is a main portion cross-sectional view showing an exemplary process included in the manufacturing method of the semiconductor device according to the embodiment.

Next, as shown in FIG. 10, a silver (Ag) layer AgL is formed on the nickel layer NiL. For example, the silver layer AgL can also be formed by a sputtering method.

6) Annealing Process

Next, the semiconductor wafer SW on which the back electrode BE is formed is annealed. The annealing treatment is preferable from the viewpoint of diffusing antimony atoms contained in the gold-antimony alloy layer AuSbL into the semiconductor substrate SUB and reducing the resistivity of the semiconductor substrate SUB. The annealing treatment can be performed in a nitrogen atmosphere. The annealing temperature of the semiconductor wafer SW is, for example, 340° C. or more and 360° C. or less.

Finally, a plurality of singulated semiconductor device SDs are obtained by dicing the semiconductor wafer SW.

<Au—Sb Alloy Target>

Figure 11:
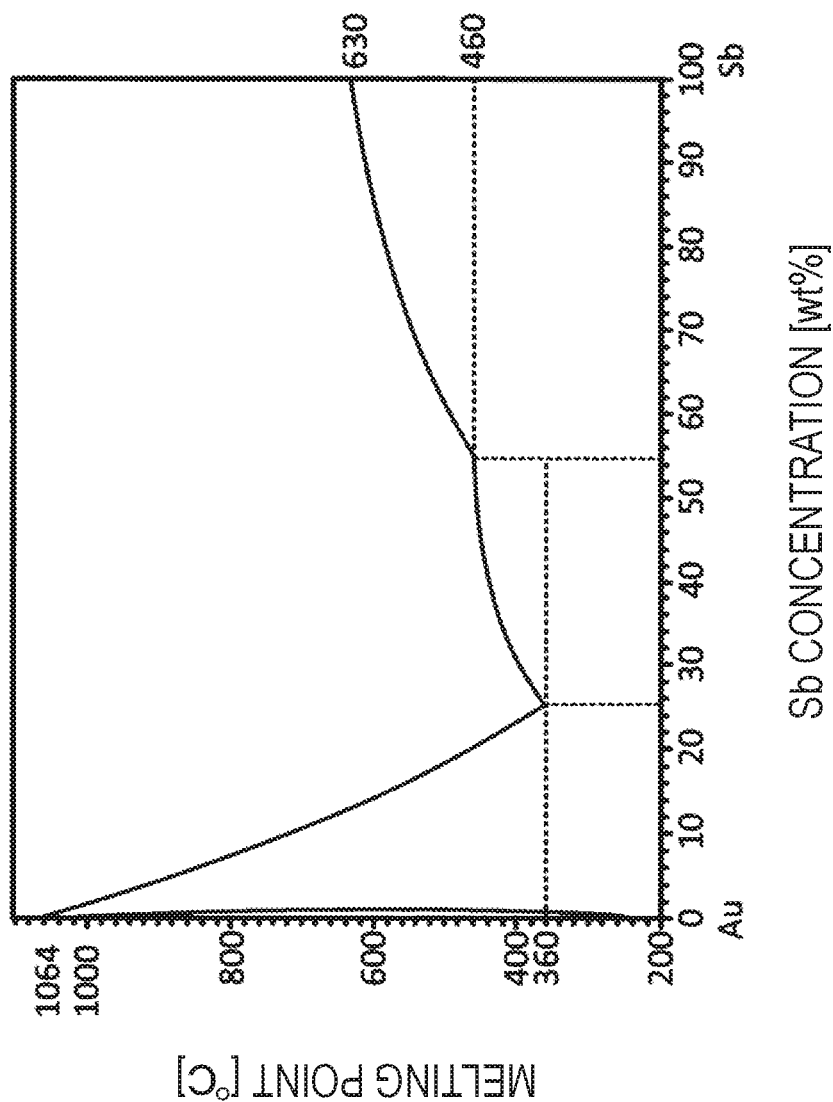
FIG. 11 is a state diagram of the Au—Sb alloy.

Here, the reason why the above target is used will be explained. FIG. 11 is a state diagram of a gold-antimony alloy. In FIG. 11, the horizontal axis represents the antimony concentration (wt %), and the vertical axis represents the melting point (° C.) of the gold-antimony alloy. As shown in FIG. 11, the melting point of the gold-antimony alloy is minimum when the antimony concentration is about 25 wt %. The melting point of the gold-antimony alloy is more than 430° C. when the antimony concentration is less than 22 wt % and more than 27 wt %. When the melting point of the gold-antimony alloy comprising the target is more than 430° C., cracks caused by the alloy compound are generated at the time of manufacturing the target, and it becomes difficult to manufacture the target.

As shown in FIG. 11, when the antimony concentration is 1 wt % or less, the melting point of the gold-antimony alloy becomes 430° C. or less, and the target can be manufactured. However, in this instance, the characteristics of the semiconductor device SDs become inadequate, as described below.

The antimony concentration of the gold-antimony alloy layer AuSbL was investigated when the gold-antimony alloy layer AuSbL was formed by using the gold-antimony alloy target with different antimony concentration. For comparison, the result of forming the gold-antimony alloy layer by the vapor deposition method are also shown. FIG. 12 is a chart showing the relationship between the antimony concentration of the target and the antimony concentration of the gold-antimony alloy AuSbL.

As shown in FIG. 12, when the antimony concentration is 0.6 wt %, the antimony concentration of the gold-antimony alloy layer formed by the sputtering method is remarkably small as compared with the case where the gold-antimony alloy layer is formed by the evaporation method, although the target having the same antimony concentration is used. This means that antimony atoms are insufficient to sufficiently reduce the resistivity of the semiconductor substrate SUB. On the other hand, when the antimony concentration is 26.0 wt %, the gold-antimony alloy layer AuSbL having a satisfactory antimony concentration can be formed. This means that antimony atoms contributing to the reduction of the resistivity of the semiconductor substrate SUB are sufficiently present in the gold-antimony AuSbL.

Experiments have shown that if the melting point of the gold-antimony alloy used as the material is too high, it is difficult to properly manufacture a target for sputtering. In addition, when the antimony concentration is too small (1.0 wt % or less), although targets can be produced, the concentration of antimony contained in the gold-antimony alloy layer AuSbL becomes insufficient. From the above viewpoint, in present embodiment, a target composed of gold-antimony alloy having an antimony concentration of 22 wt % or more and 37 wt % or less is used as a target for sputtering.

As shown in FIG. 12, it is understood that the antimony concentration of the gold-antimony alloy layer is about the same as or less than the antimony concentration of the target. For example, when a target composed of a gold-antimony alloy having an antimony concentration of 22 wt % or more and 37 wt % or less, which can be adjusted according to the sputtering conditions, is used, a gold-antimony alloy layer having an antimony concentration of 15 wt % or more and 37 wt % or less can be formed.

According to the above manufacturing method, the semiconductor device SDs according to the embodiments can be manufactured. Prior to the process of forming the back electrode BE, the semiconductor wafer SW may be ground from the second surface SF2 to adjust the thickness of the semiconductor wafer SW to a desired value. In addition, from the viewpoint of removing the oxide film on the front surface of the semiconductor wafer SW to reduce the contact resistance, it is preferable to clean the second surface SF2 of the semiconductor wafer SW, which is the formation surface of the back electrode BE, prior to the process of forming the back electrode BE. This cleaning step can be performed, for example, by immersing the semiconductor wafer SW in a cleaning solution (hydrofluoric acid, HF:H2O=1:9) for 20 seconds.

<Effect>

As described above, in the manufacturing method of semiconductor device SDs related to present embodiment, a gold-antimony alloy layer AuSbL having a thickness of 20 nm or more and 45 nm or less is formed by using a target composed of a gold-antimony alloy having an antimony concentration of 22 wt % or more and 37 wt % or less. The semiconductor device SD has a gold-antimony alloy layer AuSbL in which the antimony concentration is 15 wt % or more and 37 wt % or less, and the thickness of the gold-antimony alloy layer OOC is 20 nm or more and 45 nm or less. Appropriate amounts of antimony atoms are diffused from the gold-antimony AuSbL into the semiconductor substrate SUB. This makes it possible to achieve both high adhesion of the semiconductor substrate SUB and the back electrode BE and low resistivity of the semiconductor substrate SUB. As a result, the characteristics of the semiconductor device SDs can be enhanced.

Embodiment

Present embodiment is described in detail below with respect to Embodiment, but the present embodiment is not limited by the following Embodiment. Hereinafter, the gold-antimony alloy layer corresponds to the gold-antimony alloy layer AuSbL of present embodiment. Semiconductor substrate corresponds to the semiconductor substrate SUB of present embodiment. The back electrode corresponds to the back electrode BE of the present embodiment. The insulating layer corresponds to the insulating layer I L of present embodiment.

In the present Embodiment, a plurality of semiconductor device each having a gold-antimony alloy layer of varying thicknesses were prepared. From the viewpoint of evaluating the resistivity of semiconductor substrate, the collector-emitter saturation voltage (VCE(sat)) was measured. In addition, from the viewpoint of evaluating the adhesiveness of the semiconductor substrate and the back electrode, a peeling test was carried out.

1. Semiconductor Device (1) Preparation of Silicon Wafer

First, a silicon wafer was prepared with a thickness of 725 um as semiconductor wafers in preparation for silicon wafers. The silicon wafer has a base and an epitaxial layer formed on the base. A concentration of an antimony atom contained in the base portion is $5.0 \times 10^{18}$ cm-3. A concentration of an antimony atom contained in the epitaxial layer is $5.0 \times 10^{14}$ cm-3. The resistivity of the silicon wafer (base portion) is 0.018 Ω·cm. A portion of the semiconductor wafer constitutes a 1 n-type semiconductor area.

(2) Formation of Diffusion Layer

Next, boron was implanted into the silicon wafer to form p-type semiconductor regions having an impurity concentration of $1.0 \times 10^{18}$ cm-3. The p-type semiconductor region was then injected with phosphorus, an n-type impurity, to form a 2 n-type semiconductor region in which the n-type impurity concentration is $5.0 \times 10^{20}$ cm-3.

(3) Formation of Insulating Layer

Next, after a silicon oxide film having a thickness of 0.7 um is formed on the surface of the silicon wafer, a first opening for exposing the p-type semiconductor region and a second opening for exposing the 2 n-type semiconductor region are formed.

(4) Formation of Front Surface Electrode

Next, an aluminum film was formed on the silicon oxide film by a sputtering method so as to fill the first opening and the second opening. Next, a photomask was formed on the aluminum film by photolithography, and then the aluminum film was processed into a desired pattern by dry etching to form an emitter electrode and a base electrode.

(5) Formation of Protective Film

Next, after a protective film made of polyimide was formed on the silicon oxide film, an opening for exposing the emitter electrode and an opening for exposing the base electrode were formed in the protective film by photolithography and dry etching.

(6) Back Surface Grinding

The backside of the silicon wafer was then ground to a thickness of 200 μm.

(7) Formation of Back Surface Electrode

Next, a first titanium layer, a gold-antimony alloy layer, a second titanium layer, a nickel layer, and a silver layer were formed in this order on the back surface of the silicon wafer by using a sputtering device. The thickness of the first titanium layer was 20 nm, the thickness of the second titanium layer was 20 nm, the thickness of the nickel layer was 400 nm, and the thickness of the silver layer was 1000 nm. In the present Embodiment, gold-antimony alloy layers having a thickness of 9 nm, 20 nm, 45 nm, or 75 nm were formed using targets made of a gold-antimony alloy having an antimony content of 26.0 wt %. At this time, a gold-antimony alloy layer having different thicknesses was formed by adjusting the sputtering time. For example, in the case of forming a gold-antimony alloy layer having a thickness of 75 nm, the output power of the DC power source was set to 2 kW and the sputtering time was set to 10 seconds.

After the gold-antimony alloy layer was formed on the silicon wafer, the antimony concentration of the gold-antimony alloy layer was measured on the silicon wafer by using a dielectric-coupled plasma-mass spectrometer. For each silicon wafer, the antimony concentration of the gold-antimony alloy layer was 23.0 wt %.

(8) Annealing Process

Next, an annealing treatment was performed at 350° C. in a nitrogen atmosphere for each of the four types of silicon wafers each including a back electrode having a thickness different from one another.

2. Evaluation (1) Evaluation of Adhesiveness

A peeling test was performed on four types of silicon wafers each including a back electrode having a thickness different from one another. Specifically, 2.5 mm square grid-shaped cuts reaching the silicon wafer were formed on the front surface of the back electrode. Next, a polyester film adhesive tape (610S #25, adhesive strength (width: 25 mm); 9.32 N (950 gf)) was attached to the back electrode, and then peeled off from the back electrode. At this time, the adhesiveness of the silicon wafer and the back electrode was evaluated based on whether or not the back electrode was peeled off from the silicon wafer. For each silicon wafer, the case where peeling of the back electrode was not observed was evaluated as "0", and the case where peeling of the back electrode was observed was evaluated as "x".

(2) Evaluation of Collector-Emitter Saturating Voltage (VCE(sat))

The silicon wafers were diced to obtain a semiconductor device. Collector-to-emitter saturating voltage (VCE(sat)) was measured for each semiconductor device obtained from each silicon wafer. As the measuring condition, the collector current IC was set to 1.5 A and the base current IB was set to 150 mA. From a practical point of view, a VCE(sat) of 230 mV or less was judged to be acceptable.

(3) Conclusion

FIG. 13 is a chart showing the antimony concentration of the gold-antimony alloy layer, the thickness of the gold-antimony alloy layer, the result of evaluating the adhesiveness, the result of measuring the VCE(sat), and the classification of the respective semiconductor device.

As shown in FIG. 13, when the thickness of the gold-antimony alloy layer was 9 nm, the VCE(sat) of the gold-antimony alloy layer was high. It is considered that the thickness of the gold-antimony alloys was small and the quantity of antimony atoms diffused into the silicon substrate was insufficient, and as a result, the resistivity of the silicon substrate could not be sufficiently reduced. When the thickness of the gold-antimony alloy layer was 75 nm, the adhesion between the silicon substrate and the back electrode of the gold-antimony alloy layer was inadequate. It is considered that the thickness of the gold-antimony alloy layer is large and the amount of antimony atoms diffused into the silicon substrate is excessive, and as a result, the back electrode is separated from the silicon substrate.

On the other hand, as shown in FIG. 13, when the antimony content of the gold-antimony alloy layer was 15 wt % or more and 37 wt % or less and the thickness of the gold-antimony alloy layer was 20 nm or more and 45 nm or less, the VCE(sat) was low and the adhesion between the silicone substrate and the back electrode was excellent. That is, according to the present Embodiment, it is possible to provide a semiconductor device capable of satisfying both the reduction of the resistivity of the silicon substrate and the adhesiveness of the silicon substrate and the back surface electrode.

It should be noted that the present invention is not limited to the above-mentioned embodiments, and various modifications can be made without departing from the gist thereof.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and the mode containing other components is not excluded.

What is claimed is:

1. A semiconductor device comprising:
  a semiconductor substrate; and
  an electrode formed on the semiconductor substrate, and including an Au—Sb alloy layer,
  wherein a concentration of Sb in the Au—Sb alloy layer is equal to or greater than 15 wt %, and equal to or less than 37 wt %,
  wherein a thickness of the Au—Sb alloy layer is equal to or larger than 20 nm, and equal to or less than 45 nm, and
  wherein the electrode further includes a Ti layer between the semiconductor substrate and the Au—Sb alloy layer.

2. The semiconductor device according to claim 1, wherein the thickness of the Au—Sb alloy layer is equal to or larger than 25 nm, and equal to or less than 35 nm.

3. The semiconductor device according to claim 1, wherein a thickness of the Ti layer is equal to or larger than 15 nm, and equal to or less than 30 nm.

4. The semiconductor device according to claim 1,
  wherein the semiconductor substrate is made of silicon, and
  wherein the electrode is a back surface electrode contacted with a back surface of the semiconductor substrate.

5. The semiconductor device according to claim 1, wherein a region of the semiconductor substrate, on an electrode side, contains n-type impurity.

6. The semiconductor device according to claim 5, wherein the n-type impurity is one of antimony atom, phosphorus atom and arsenic atom.

* * * * *